(12) United States Patent
Abernathy

(10) Patent No.: US 6,801,090 B1
(45) Date of Patent: Oct. 5, 2004

(54) HIGH PERFORMANCE DIFFERENTIAL AMPLIFIER

(75) Inventor: Brian Lee Abernathy, Escondido, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 207 days.

(21) Appl. No.: 10/218,400

(22) Filed: Aug. 13, 2002

(51) Int. Cl.[7] .............................................. H03F 3/45
(52) U.S. Cl. ..................................................... 330/301
(58) Field of Search ................................ 330/252, 261, 330/280, 283, 301

(56) References Cited

U.S. PATENT DOCUMENTS 6,559,723 B2 * 5/2003 Hollenbeck et al. ........ 330/301

* cited by examiner

*Primary Examiner*—Steven J. Mottola
(74) *Attorney, Agent, or Firm*—Law Office of Gerald Maliszewski; Gerald Maliszewski

(57) ABSTRACT

An enhanced performance differential output amplifier and differential amplification method are provided. The amplifier comprises a first transistor to accept a single-ended input signal and supply a first output signal, and a second transistor to supply a second output signal, approximately 180 degrees out of phase from the first output signal. A first capacitor is connected between the base of the first transistor and the emitter of the second transistor. A second capacitor is connected between the emitter of the first transistor and first voltage. At least one emitter resistor, but typically two, is connected between the emitters of the first and second transistors, and a current source. The collectors of the first and second transistors are operatively connected to the first voltage, typically through resistors. The current source is connected between the emitter resistors and a second voltage (Vee) having a lower potential than the first voltage.

20 Claims, 2 Drawing Sheets

HIGH PERFORMANCE DIFFERENTIAL AMPLIFIER

BACKGROUND OF THE INVENTION

1. Field of the Invention

This invention generally relates to transistor circuitry and, more particularly, to an improved bandwidth amplifier that accepts a single-ended input signal and provides a differential output signal.

2. Description of the Related Art

FIG. 1 is a schematic of a simple circuit employing a speed-up capacitor (prior art). As shown, the speed-up capacitor provides a high frequency low impedance path, in parallel to the resistor. Such a circuit is used to increase the circuit bandwidth or to improve high frequency transient response. The use of speed-up capacitors with single-ended amplifiers is also well known. A single-ended amplifier accepts a single-ended signal input and supplies a single-ended signal output. A single-ended signal is a signal measured with respect to a voltage potential, such as ground.

Likewise, it is known to use speed-up capacitors in differential amplifiers that accept a differential input signal and supply a differential output signal. A differential signal includes a first signal and a second signal approximately 180 degrees out of phase from the first signal. Differential amplifiers are a common component of emitter-coupled logic (ECL) circuits. Any speed-up capacitor added to enhance the response of the first signal must be matched with a speed-up capacitor to enhance the response of the second signal.

However, the addition of speed-up capacitors to circuitry is not always trivial, as dc biasing and other ac signal amplification characteristics can be a concern. One particular problem has been in the use of differential amplifiers that accept a single-ended input signal, but supply a differential output signal. Since such a differential amplifier is not completely symmetrical in design, it is difficult to add a speed-up capacitor that evenly affects both the signal outputs.

It would be advantageous if speed-up capacitors could be used in a differential amplifier that accepts a single-ended input and supplies a differential signal output.

SUMMARY OF THE INVENTION

The present invention provides a single-ended to differential output amplifier that provides an improved bandwidth using capacitors in a manner similar to the above-mentioned speed-up capacitors.

Accordingly, an enhanced performance differential output amplifier is provided comprising a first transistor to accept a single-ended input signal and supply a first output signal, and a second transistor to supply a second output signal, approximately 180 degrees out of phase from the first output signal. A first capacitor is connected between the base of the first transistor and the emitter of the second transistor. A second capacitor is connected between the emitter of the first transistor and first voltage. At least one emitter resistor, but typically two, is connected between the emitters of the first and second transistors, and a current source.

The collectors of the first and second transistors are operatively connected to the first voltage, typically through resistors. The current source is connected between the emitter resistors and a second voltage (Vee) having a lower potential than the first voltage.

Typically, bias circuits are connected to the differential amplifier. A first bias circuit includes a (fifth) transistor having a base to accept an input signal and a collector connected to a third voltage (Vcc), having a higher potential than the first voltage. An impedance matching resistor is connected between the base and the first voltage. An emitter-follower joins the fifth transistor emitter to the first transistor base. A second, equivalent bias circuit biases the second transistor.

Additional details of the above-described differential amplifier, and a method for differentially amplifying a single-ended input signal are provided below.

DETAILED DESCRIPTION OF THE PREFERRED EMBODIMENTS

Figure 2:
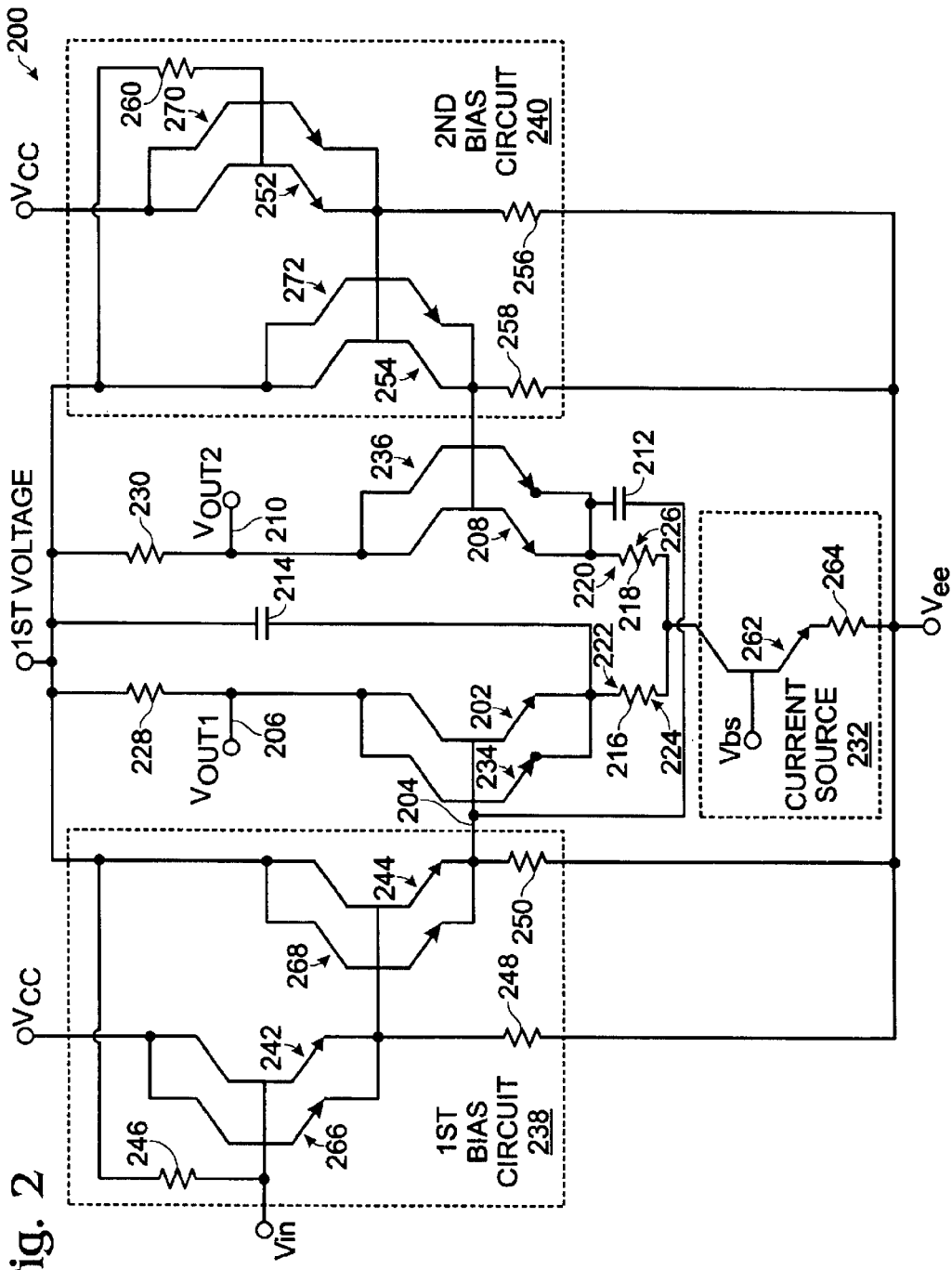
FIG. 2 is a schematic diagram of the present invention enhanced performance differential output amplifier.

FIG. 2 is a schematic diagram of the present invention enhanced performance differential output amplifier. The amplifier 200 comprises a first transistor 202 having a base to accept a single-ended input signal on line 204, an emitter, and a collector to supply a first output signal (Vout1) on line 206. A second transistor 208 has a base, a collector to supply a second output signal (Vout2) on line 210, approximately 180 degrees out of phase from the first output signal, and an emitter.

A first capacitor 212 is connected between the base of the first transistor 202 and the emitter of the second transistor 208. A second capacitor 214 is connected between the emitter of the first transistor and first voltage. In some aspects, the first voltage can.be ground (gnd). At least a first resistor 216 is connected between the emitter of first transistor 202 and the emitter of the second transistor 208. Typically, two equal value resistors are used to maintain a constant current flow through the first and second transistors 202/208. As shown, a second resistor 218 has a first end 220 connected to the emitter of the second transistor 208. Then, the first resistor 216 has a first end 222 connected to the emitter of the first transistor 202 and a second end 224 connected to a second end 226 of the second resistor.

Generally, the first transistor 202 forms a common emitter amplifier that inverts the output signal. The second transistor 208 forms a common base amplifier that is non-inverting. Conventionally, as current flow decreases through the first transistor, it increases in the second transistor. In this manner, the second transistor 208 generates an output signal that is 180 degrees out of phase from the first transistor 202 output signal.

For example, the input signal can be a rising edge. The second capacitor 214 acts to momentarily delay any increase in voltage, responsive to the input signal, at the emitter of the first transistor 202. This capacitive effect acts to quicken the ac signal throughput from the first transistor base to the collector. Thus, the second capacitor 214 acts as a speed-up capacitor for the first transistor 202. However, any transient response improvement made in the first output signal must be matched in the second output signal. To that end, the first capacitor 212 couples the single-ended input signal from the base of the first transistor 202 to the emitter of the second transistor 208. The capacitive effect anticipates changes to the second transistor, permitting the second transistor to turn off faster as the first transistor turns on.

The collectors of the first and second transistors 202/208 are connected to the first voltage. In most circumstances, the first and second transistors use the same supply and to maintain isolation between the output signals, the collectors are operatively connected to the first voltage. That is, a third resistor 228 is connected between the first voltage and the collector of the first transistor 202. A fourth resistor 230 is connected between the first voltage and the collector of the second transistor 208.

A current source 232 is connected between the first resistor and a second voltage (Vee) having a lower potential than the first voltage. If the first voltage is ground, then the second voltage can be a value such as −5.2 Vdc. However, the present invention is not limited to any specific power supply voltage values, and the relative potential between the first and second voltages may vary in different aspects of the amplifier. The first and second resistors 216 and 218 could be directly connected to Vee, or connected to Vee through a resistor. However, a more constant current can be maintained using a transistor, as explained in detail below.

In some aspects of the amplifier 200, a second set of transistors may be paralleled with the first and second transistors 202/208. Then, a third transistor 234 has a base connected to the base of the first transistor 202, a collector connected to the first voltage, and an emitter connected to the emitter of the first transistor 202. A fourth transistor 236 has a base connected to the base of the second transistor 208, a collector connected to the first voltage, and an emitter connected to the emitter of the second transistor 208.

A first bias circuit 238 has an output connected to the base of the first transistor 202. A second bias circuit 240 has an output connected to the base of the second transistor 208. The bias circuits provide dc bias current to the differential amplifier (202/208) and offset the dc level of the ac input signal. An example of a bias circuit follows. However, the present invention amplifier 200 is not limited to just this bias circuit design.

The present invention bias circuit 238 solves a problem associated with conventional bias circuits. In additional to providing a dc bias to the first transistor 202, the first bias circuit 238 must also process the single-ended input signal. Conventionally, a dc blocking, or series capacitor is the first element in such a circuit, to block the dc voltage of an interfacing circuit (not shown). Then, a dc bias is established for the initial (fifth) transistor. However, the combination of bias resistors and series capacitor can have a detrimental effect on high frequency ac signals. The present invention bias circuit solves this problem by eliminating the series capacitor and using a higher voltage source for the initial (fifth) transistor.

The first bias circuit 238 includes a fifth transistor 242 having a base, a collector connected to a third voltage (Vcc), having a higher potential than the first voltage, and an emitter. The base of the fifth transistor accepts the input signal. In some aspects of the amplifier, the third voltage is approximately 1.5 Vdc. Again however, the present invention is not limited to any specific power supply voltage values, and the relative potential between the first and third voltages may vary. A sixth transistor 244 has a base connected to the emitter of the fifth transistor 242, a collector connected to the first voltage, and an emitter connected to the base of the first transistor 202. An impedance matching resistor 246 connects between the base of the fifth transistor and the first voltage. In some aspects, the impedance matching resistor has a resistance of approximately 50 ohms. A fifth resistor 248 is connected between the emitter of the fifth transistor 242 and the second voltage. A sixth resistor 250 is connected between the emitter of the sixth transistor 244 and the second voltage.

The second bias circuit 240 is equivalent to the first bias circuit 238, but it does not receive an ac input signal (the input is single-ended). The second bias circuit 240 includes a seventh transistor 252 having a base, a collector connected to the third voltage, and an emitter. An eighth transistor 254 has base connected to the emitter of the seventh transistor 252, a collector connected to the first voltage, and an emitter connected to the base of the second transistor 208. A seventh resistor 256 is connected between the emitter of the seventh transistor 252 and the second voltage. An eighth resistor 258 is connected between the emitter of the eighth transistor 254 and the second voltage. A ninth resistor 260 is connected between the base of the seventh transistor 252 and the first voltage.

The current source 232 includes a ninth transistor 262 having a collector connected to the second ends 224/226 of the first and second resistors, a base to accept a bias voltage (Vbs), and an emitter. A tenth resistor 264 is connected between the emitter of the ninth transistor 262 and the second voltage. The amplifier 200 will also operate with other conventional current sources.

In some aspects of the amplifier, the bias transistors are paralleled with additional transistors. Then, the first bias circuit 238 further includes a tenth transistor 266 having a base connected to the base of the fifth transistor 242, a collector connected to the third voltage, and an emitter connected to the emitter of the fifth transistor 242. Likewise, an eleventh transistor 268 has base connected to the base of the sixth transistor 244, a collector connected to the first voltage, and an emitter connected to the emitter of the sixth transistor 244.

The second bias circuit 240 further includes a twelfth transistor 270 having a base connected to the base of the seventh transistor 252, a collector connected to the third voltage, and an emitter connected to the emitter of the seventh transistor 252. A thirteenth transistor 272 has a base connected to the base of the eighth transistor 252, a collector connected to the first voltage, and an emitter connected to the emitter of the eighth transistor 254.

As shown, all the above-mentioned transistors are npn transistors. However, one skilled in the art could design an equivalent amplifier with pnp transistors, or a mixture of npn and pnp transistors. Further, FET transistors could be used in the bias and current source circuits.

Figure 1:
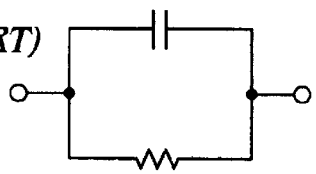
FIG. 1 is a schematic of a simple circuit employing a speed-up capacitor (prior art).
Figure 3:
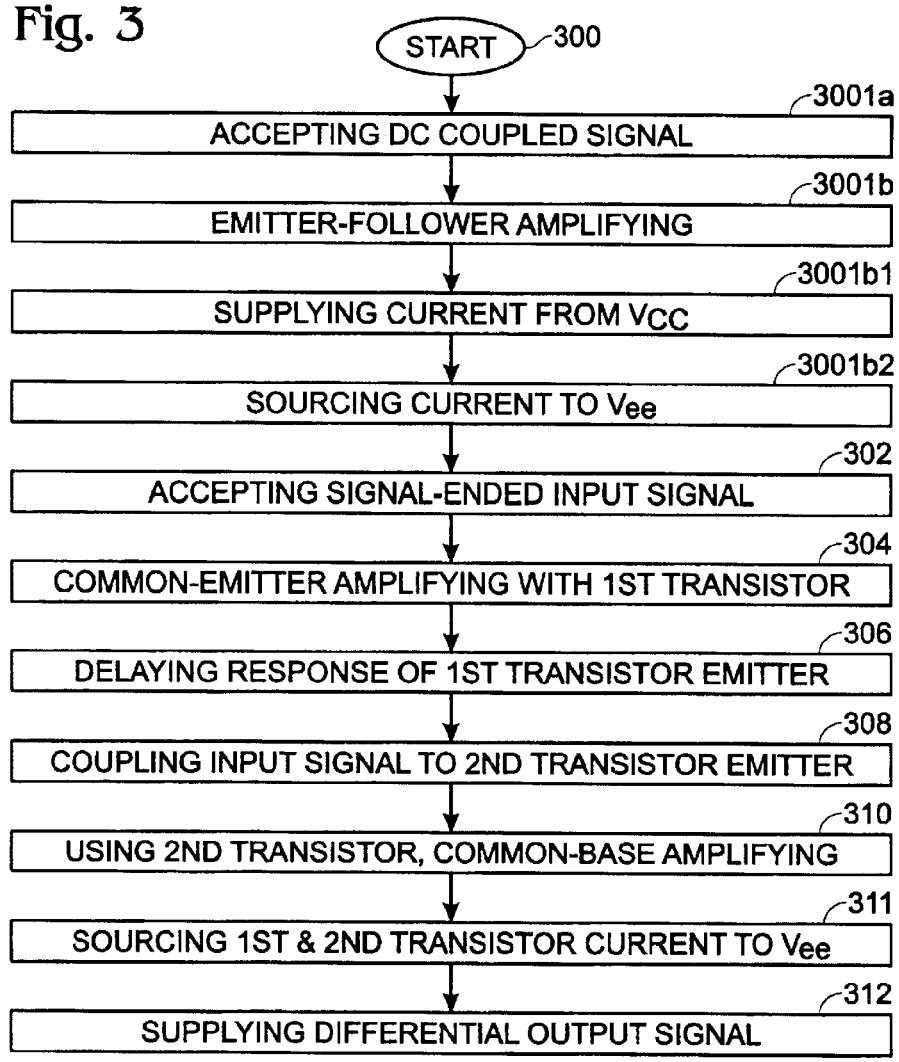
FIG. 3 is a flowchart illustrating the present invention method for differentially amplifying a single-ended input signal.

FIG. 3 is a flowchart illustrating the present invention method for differentially amplifying a single-ended input signal. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 300.

Step 302 accepts a single-ended input signal. Step 304, using a first transistor, common-emitter amplifies the input signal. Step 306 delays the response of the first transistor emitter to positive changes in voltage. Step 308 couples the input signal to the emitter of a second transistor. Step 310, using the second transistor, common-base amplifies the coupled input signal. Step 312 supplies a differential output signal responsive to the input signal.

In some aspects of the method, coupling the input signal to the emitter of a second transistor in Step 308 includes capacitively coupling the input signal.

In other aspects, common-emitter amplifying and common-base amplifying in Steps 304 and 310, respectively, includes supplying. current to the first and second transistors from a first voltage. Then, delaying the response of the first transistor emitter to positive changes in voltage in Step 306 includes capacitively coupling the first transistor emitter to the first voltage.

Some aspects of the method include further steps. Step 311 sources current from the first and second transistors through a common source to a second voltage (Vee) having a lower potential than the first voltage.

Other aspects include further steps. Step 301a accepts a dc coupled signal. Step 301b emitter-follower amplifies the dc coupled signal. Then, accepting a single-ended input signal in Step 302 includes accepting the emitter-follower amplified output as the input signal.

In some aspects of the method, emitter-follower amplifying the dc coupled signal in Step 301b includes substeps. Step 301b1 supplies current from a third voltage (Vcc), having a higher potential than the first voltage. Step 301b2 sources current to the second voltage.

A system and method has been provided for improving the transient response of a differential amplifier accepting a single-ended input signal. A practical example of such as circuit has been provided to explain the invention. However, the present invention is not limited to merely this example. Other variations and embodiments of the invention will occur to those skilled in the art.

I claim:

1. An enhanced performance differential output amplifier comprising:
   a first transistor having a base to accept a single-ended input signal, an emitter, and a collector to supply a first output signal;
   a second transistor having a base, a collector to supply a second output signal, approximately 180 degrees out of phase from the first output signal, and an emitter;
   a first capacitor connected between the base of the first transistor and the emitter of the second transistor;
   a second capacitor connected between the emitter of the first transistor and first voltage;
   at least a first resistor connected between the emitter of first transistor and the emitter of the second resistor; and,
   wherein the collectors of the first and second transistors are connected to the first voltage.

2. The amplifier of claim 1 further comprising:
   a current source connected between the first resistor and a second voltage (Vee) having a lower potential than the first voltage.

3. The amplifier of claim 2 further comprising:
   a third transistor having a base connected to the base of the first transistor, a collector connected to the first voltage, and an emitter connected to the emitter of the first transistor; and,
   a fourth transistor having a base connected to the base of the second transistor, a collector connected to the first voltage, and an emitter connected to the emitter of the second transistor.

4. The amplifier of claim 2 further comprising:
   a second resistor having a first end connected to the emitter of the second transistor, and a second end; and,
   wherein the first resistor has a first end connected to the emitter of the first transistor and a second end connected to the second end of the second transistor.

5. The amplifier of claim 4 further comprising:
   a third resistor connected between the first voltage and the collector of the first transistor; and,
   a fourth resistor connected between the first voltage and the collector of the second transistor.

6. The amplifier of claim 5 further comprising:
   a first bias circuit having an output connected to the base of the first transistor; and,
   a second bias circuit having an output connected to the base of the second transistor.

7. The amplifier of claim 6 wherein the first bias circuit includes:
   a fifth transistor having a base, a collector connected to a third voltage (Vcc), having a higher potential than the first voltage, and an emitter;
   a sixth transistor having a base connected to the emitter of the fifth transistor, a collector connected to the first voltage, and an emitter connected to the base of the first transistor;
   an impedance matching resistor connected between the base of the fifth transistor and the first voltage;
   a fifth resistor connected between the emitter of the fifth transistor and the second voltage; and,
   a sixth resistor connected between the emitter of the sixth transistor and the second voltage.

8. The amplifier of claim 7 wherein the second bias circuit includes:
   a seventh transistor having a base, a collector connected to the third voltage, and an emitter;
   an eighth transistor having a base connected to the emitter of the seventh transistor, a collector connected to the first voltage, and an emitter connected to the base of the second transistor;
   a seventh resistor connected between the emitter of the seventh transistor and the second voltage;
   an eighth resistor connected between the emitter of the eighth transistor and the second voltage; and,
   a ninth resistor connected between the base of the seventh transistor and the first voltage.

9. The amplifier of claim 7 wherein the base of the fifth transistor accepts the input signal.

10. The amplifier of claim 9 wherein the impedance matching resistor has a resistance of approximately 50 ohms.

11. The amplifier of claim 6 wherein the current source includes:
    a ninth transistor having a collector connected to the second ends of the first and second resistors, a base to accept a bias voltage (Vbs), and an emitter; and,
    a tenth resistor connected between the emitter of the ninth transistor and the second voltage.

12. The amplifier of claim 7 wherein the first bias circuit further includes:
    a tenth transistor having a base connected to the base of the fifth transistor, a collector connected to the third voltage, and an emitter connected to the emitter of the fifth transistor; and,
    an eleventh transistor having a base connected to the base of the sixth transistor, a collector connected to the first voltage, and an emitter connected to the emitter of the sixth transistor.

13. The amplifier of claim 8 wherein the second bias circuit further includes:

a twelfth transistor having a base connected to the base of the seventh transistor, a collector connected to the third voltage, and an emitter connected to the emitter of the seventh transistor; and, a thirteenth transistor having a base connected to the base of the eighth transistor, a collector connected to the first voltage, and an emitter connected to the emitter of the eighth transistor.

14. The amplifier of claim 8 wherein the first, second, third, fourth, fifth, sixth, seventh, and eighth transistors are npn transistors.

15. An enhanced performance differential output amplifier comprising:

a first transistor having a base to accept a single-ended input signal, an emitter, and a collector to supply a first output signal;

a second transistor having a base, a collector to supply a second output signal, approximately 180 degrees out of phase from the first output signal, and an emitter;

a first capacitor connected between the base of the first transistor and the emitter of the second transistor;

a second capacitor connected between the emitter of the first transistor and a first voltage;

a first resistor having a first end connected to the emitter of the first transistor, and a second end;

a second resistor having a first end connected to the emitter of the second transistor, and a second end connected to the second end of the first resistor;

a current source connected between the second ends of the first and second resistors, and a second voltage (Vee), lower in potential than the first voltage;

a third resistor connected between the first voltage and the collector of the first transistor; and, a fourth resistor connected between the first voltage and the collector of the second transistor.

16. The amplifier of claim 15 further comprising a first bias circuit, the first bias circuit including:

a fifth transistor having a base, a collector connected to a third voltage (Vcc) having a higher potential than the first voltage, and an emitter;

a sixth transistor having a base connected to the emitter of the fifth transistor, a collector connected to the first voltage, and an emitter connected to the base of the first transistor;

an impedance matching resistor connected between the base of the fifth transistor and the first voltage;

a fifth resistor connected between the emitter of the fifth transistor and the second voltage; and, a sixth resistor connected between the emitter of the sixth transistor and the second voltage; and, a second bias circuit, the second bias circuit including:

a seventh transistor having a base, a collector connected to the third voltage, and an emitter;

an eighth transistor having a base connected to the emitter of the seventh transistor, a collector connected to the first voltage, and an emitter connected to the base of the second transistor;

a seventh resistor connected between the emitter of the seventh transistor and the second voltage;

an eighth resistor connected between the emitter of the eighth transistor and the second voltage; and, a ninth resistor connected between the base of the seventh transistor and the first voltage.

17. A method for differentially amplifying a single-ended input signal:

accepting a single-ended input signal;

using a first transistor, common-emitter amplifying the input signal;

delaying the response of the first transistor emitter to positive changes in voltage;

capacitively coupling the input signal to the emitter of a second transistor;

using the second transistor, common-base amplifying the coupled input signal;

supplying a differential output signal responsive to the input signal;

wherein common-emitter amplifying and common-base amplifying includes supplying current to the first and second transistors from a first voltage; and, wherein delaying the response of the first transistor emitter to positive changes in voltage includes capacitively coupling the first transistor emitter to the first voltage.

18. The method of claim 17 further comprising:

sourcing current from the first and second transistors through a common source to a second voltage (Vee) having a lower potential than the first voltage.

19. The method of claim 17 further comprising:

accepting a dc coupled signal;

emitter-follower amplifying the dc coupled signal; and, wherein accepting a single-ended input signal includes accepting the emitter-follower amplified output as the input signal.

20. The method of claim 19 wherein emitter-follower amplifying the dc coupled signal includes:

supplying current from a third voltage (Vcc), having a higher potential than the first voltage; and, sourcing current to the second voltage.

* * * * *